United States Patent [19]

Hayashi

[11] Patent Number: 5,536,960

[45] Date of Patent: Jul. 16, 1996

[54] VLSIC SEMICONDUCTOR MEMORY DEVICE WITH CROSS-COUPLED INVERTERS WITH IMPROVED STABILITY TO ERRORS

[75] Inventor: Fumihiko Hayashi, Tokyo, Japan

[73] Assignee: NEC Corporation, Tokyo, Japan

[21] Appl. No.: 362,156

[22] Filed: Dec. 22, 1994

[30] Foreign Application Priority Data

Dec. 24, 1993 [JP] Japan .................................. 5-326549

[51] Int. Cl.[6] .............................. G11C 11/00; G11C 7/00; H01L 27/11
[52] U.S. Cl. ....................... 257/369; 257/297; 257/903; 365/154; 365/156; 365/190
[58] Field of Search ..................................... 257/369, 296, 257/297, 903, 904; 365/154, 155, 156, 190

[56] References Cited

U.S. PATENT DOCUMENTS 4,805,148  2/1989  Diehl-Nagle et al. ............... 257/297

OTHER PUBLICATIONS

"Improvement of Soft Error Immunity in a Polysilicon PMOS Load Memory Cell" by Ueda et al., published on Autumnal Conference of the Institute of Electronics, Information, and Communication Engineers in 1991, pp. 5–141.

Primary Examiner—Robert P. Limanek
Assistant Examiner—David B. Hardy
Attorney, Agent, or Firm—Sughrue, Mion, Zinn, Macpeak & Seas

[57] ABSTRACT

A static random access memory (SRAM) has a plurality of static memory cells each of which has a set of cross coupled inverters having first and second inverters. The first inverter has first and second transistors. The second inverter has primary and secondary transistors. Each of the first and the primary transistors may be, for example, a P-channel transistor. Each of the second and the secondary transistors may be, for example, an N-channel transistor. The static memory cell further has a first diode having a first forward direction and a second diode having a second forward direction. The first forward direction is directed from drains of the primary and secondary transistors to a gate of the first transistor. The second forward direction is directed from drains of the first and the second transistors to a gate of the primary transistor.

5 Claims, 9 Drawing Sheets

VLSIC SEMICONDUCTOR MEMORY DEVICE WITH CROSS-COUPLED INVERTERS WITH IMPROVED STABILITY TO ERRORS

BACKGROUND OF THE INVENTION

This invention relates to a semiconductor memory device comprising a set of cross-coupled inverters having a pair of inverters.

In general, a static random access memory (SRAM) is known as a semiconductor device comprising a plurality of memory cells each of which will be called a static memory cell. Each of the static memory cells is composed of a set of cross-coupled inverters having a pair of inverters. Each of the inverters comprises one transistor and one load element. More particularly, a P-channel transistor or a resistor is used as the load element.

In general, the P-channel transistor load memory cell is more stable against noise or alpha rays than the resistor load memory cell. However, the P-channel transistor load cell still has unstability based on the noise or the alpha rays. In order to prevent this unstability, a conventional SRAM is disclosed in proceedings C-427 published on Autumnal Conference of the Institute of Electronics, Information, and Communication Engineers in 1991. The conventional SRAM comprises a plurality of static memory cells each of which has a set of cross-coupled inverters and a delay circuit having a high resistance value. In the conventional SRAM, it is possible to prevent the unstability of the static memory cell that is based on the noise or the alpha rays as will later be described in detail.

However, the resistance value of the delay circuit decreases in the static memory cell of the conventional SRAM as the static memory cell of the conventional SRAM is micronized in size. When the resistance value of the delay circuit decreases, it is difficult to obtain a delay effect of the delay circuit as will later be described. As a result, it is difficult to prevent the conventional SRAM from the unstability based on the noise or the alpha rays when the static memory cell of the conventional SRAM is micronized in size.

SUMMARY OF THE INVENTION

It is therefore an object of this invention to provide a semiconductor memory device of a very large scaled integrated circuit with stability.

Other objects of this invention will become clear as the description proceeds.

According to an aspect of this invention, there is provided a semiconductor memory device comprising a set of cross coupled inverters having first and second inverters. The first inverter comprises a first transistor of a first conductivity type and a second transistor of a second conductivity type. The second inverter comprises a primary transistor of the first conductivity type and a secondary transistor of the second conductivity type. The semiconductor memory device further comprises a first diode having a first forward direction which is directed from drains of the primary and the secondary transistors to a gate of the first transistor, and a second diode having a second forward direction which is directed from drains of the first and the second transistors to a gate of the primary transistor.

According to another aspect of this invention, there is provided a semiconductor memory device comprising a first transistor of a first conductivity type that has a first gate, a first drain, and a first source, a primary transistor of the first conductivity type that has a primary gate, a primary drain, and a primary source, a second transistor of a second conductivity type that has a second gate, a second drain, and a second source, a secondary transistor of the second conductivity type that has a secondary gate, a secondary drain, and a secondary source, a first diode having a first cathode and a first anode, a second diode having a second cathode and a second anode, and a capacitor. The first source is connected to a reference voltage. The primary source is connected to the reference voltage. The second source is connected to ground. The second drain is connected to the first drain. The secondary source is connected to the ground. The secondary drain is connected to the primary drain. The first cathode is connected to the first gate. The first anode is connected to the second gate and the primary and the secondary drains. The second cathode is connected to the primary gate. The second anode is connected to the secondary gate and the first and the second drains. The first gate is connected to the primary gate through the capacitor.

DESCRIPTION OF THE PREFERRED EMBODIMENTS

Figure 1:
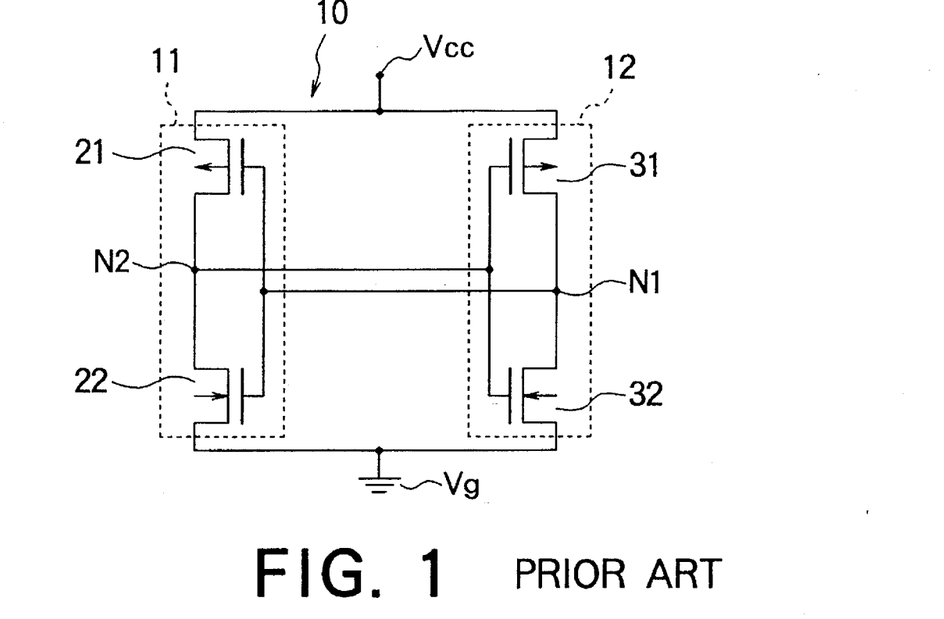
FIG. 1 is a circuit diagram of a first conventional SRAM cell.

Referring to FIG. 1, description will be made as regards a first conventional static random access memory (SRAM) for a better understanding of this invention. The SRAM comprises a plurality of static memory cells although only one of static memory cells is illustrated in FIG. 1. In FIG. 1, the static memory cell is designated by a reference numeral 10 and pass transistors are omitted each of which is for use in allowing data to pass into and out of the static memory cell 10. The static memory cell 10 comprises a set of cross-coupled inverters having first and second inverters 11 and 12. Each of the first and the second inverters 11 and 12 may be, for example, a CMOS (complementary metal oxide semiconductor) inverter.

The first inverter 11 comprises a first transistor 21 of a first conductivity type and a second transistor 22 of a second conductivity type. More particularly, the first transistor 21 is a P-channel transistor which may be, for example, a thin-film transistor. The second transistor 22 is an N-channel transistor which may be, for example, a thin-film transistor. The first and the second transistors 21 and 22 have their source-to-drain paths connected in series between a reference voltage Vcc and ground Vg and have their gates tied to each other.

Similarly, the second inverter 12 comprises a primary transistor 31 of the first conductivity type and a secondary transistor 32 of the second conductivity type. The primary and the secondary transistors 31 and 32 have their source-to-drain paths connected in series between the reference voltage Vcc and the ground Vg and have their gates tied to each other.

The gates of the first and the second transistors 21 and 22 are connected to the drains of the primary and the secondary transistors 31 and 32 at a node labelled N1. The gates of the primary and the secondary transistors 31 and 32 are connected to the drains of the first and the second transistors 21 and 22 at a node labelled N2.

The voltages of the nodes N1 and N2 will necessarily be logical complements of each other due to a cross-coupled nature of the first and the second inverters 11 and 12. It will be assumed that logic high and low levels appear at the nodes N2 and N1, respectively. When the high level appears at the node N2, the first transistor 21 is in an on-state. Otherwise, the second transistor 22 is in an off-state. When the low level appears at the node N1, the primary transistor 31 is in the off-state and the secondary transistor 32 is in the on-state.

It will be assumed that the voltage of the node N2 instantaneously drops on the basis of noise or alpha rays. When the voltage of node N2 instantaneously drops, an electric charge is supplied from the reference voltage Vcc to the node N2 through the first transistor 21. As a result, the voltage of the node N2 may be recovered to the high level. On the other hand, the primary transistor 31 may become to the on-state and the secondary transistor 32 may become to the off-state before the voltage of the node N2 is recovered to the high level. Under the circumstances, the voltage of the node N1 rises. Namely, the high level appears at the node N1.

When the high level appears at the node N1, the first transistor 21 becomes to the off-state and the second transistor 22 becomes to the on-state. As readily understood from the above description, soft error may occur in the static memory cell 10 on the basis of the noise or the alpha rays. Namely, the static memory cell 10 becomes unstable on the basis of the noise or the alpha rays.

Figure 2:
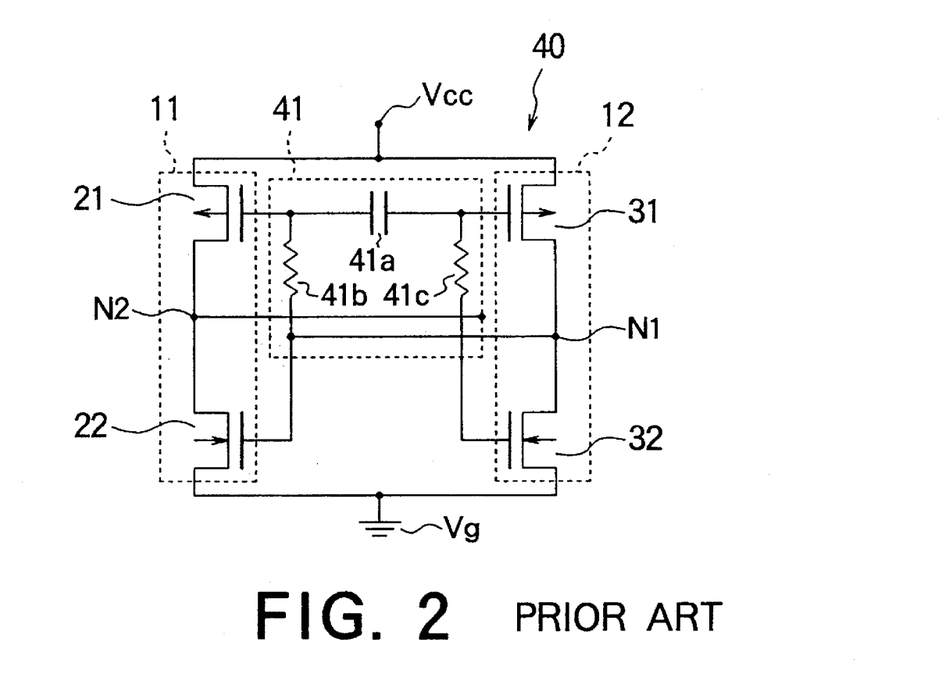
FIG. 2 is a circuit diagram of a second conventional SRAM cell.

In order to prevent the soft error in the static memory cell 10 of the SRAM, it is known a second conventional SRAM comprising a static memory cell illustrated in FIG. 2.

Referring to FIG. 2, the illustrated static memory cell is different in structure from the static memory cell 10 illustrated in FIG. 1 and is therefore designated afresh by a reference numeral 40. The static memory cell 40 comprises similar parts which are designated by like reference numerals.

The static memory cell 40 further comprises a delay circuit 41 having a capacitor 41a and first and second resistors 41b and 41c. The first and the second resistors 41b and 41c have first and second resistance values, respectively. In the example being illustrated, the capacitor 41a is located between the gate of the first transistor 21 and the gate of the primary transistor 31. Namely, the gate of the first transistor 21 is connected to the gate of the primary transistor 31 through the capacitor 41a. The gate of the first transistor 21 is connected to the drains of the primary and the secondary transistors 31 and 32 through the first resistor 41b. The gate of the primary transistor 31 is connected to the drains of the first and the second transistors 21 and 22 through the second resistor 41c.

It will be assumed that each of the transistors 21, 22, 31, and 33 is the thin-film transistor. When each of the first and the secondary transistors 21 and 32 is in the on-state and each of the primary and the second transistors 31 and 22 is in the off-state, the high and the low levels appear at the nodes N2 and N1, respectively, as described in conjunction with FIG. 1. When the high level appears at the node N2, the electric charge of $10^{-14}$ coulombs is accumulated at the node N2. Otherwise, the first transistor 21 can pass the current of $10^{-8}$ to $10^{-7}$ amperes therethrough when the first transistor 21 is in the on-state. Therefore, it is possible to make the voltage of the node N2 become the high level after $10^{-6}$ to $10^{-7}$ seconds lapses when the voltage of the node N2 instantaneously drops on the basis of the noise or alpha rays. When the delay circuit 41 has a time constant longer than $10^{-6}$ to $10^{-7}$ seconds, it is possible to make the voltage of the node N2 become to the high level before the primary transistor 31 becomes to the on-state.

In general, the capacitor 41a has a capacitance of $10^{-15}$ farads. Therefore, it is possible for the delay circuit 41 to have the time constant longer than $10^{-6}$ to $10^{-7}$ seconds when each of the first and the second resistance values has a resistance value greater than $10^8$ ohms. By using the delay circuit 41, the voltage of the node N2 is recovered to the high level before the primary transistor 31 becomes to the on-state in the static memory cell 40 when the instantaneous voltage drop occurs at the node N2 on the basis of the noise or the alpha rays. Therefore, it is possible to prevent the soft error in the static memory cell 40. Namely, it is possible to prevent the static memory cell 40 from unstability based on the noise or the alpha rays.

Figure 3:
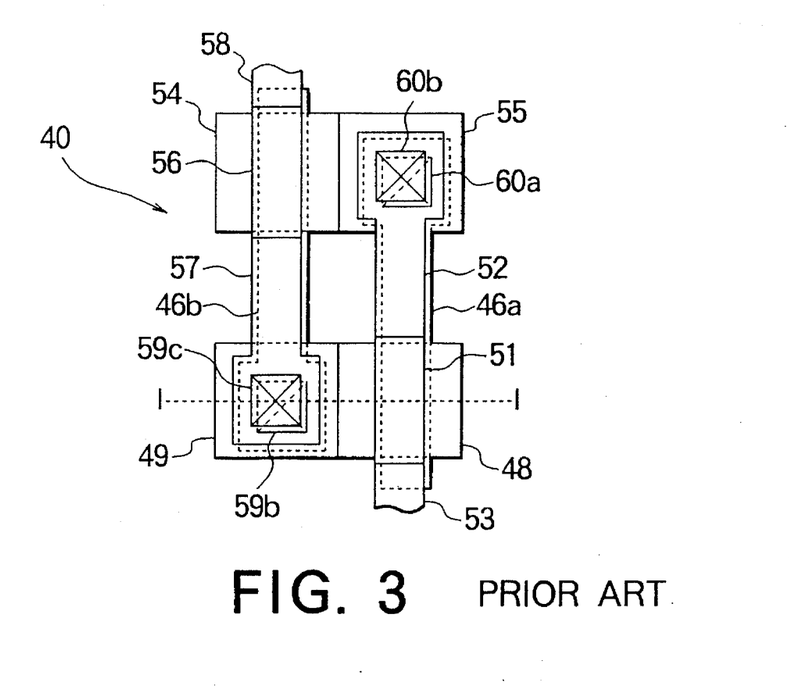
FIG. 3 shows a plan view of the SRAM cell illustrated in FIG. 2.
Figure 4:
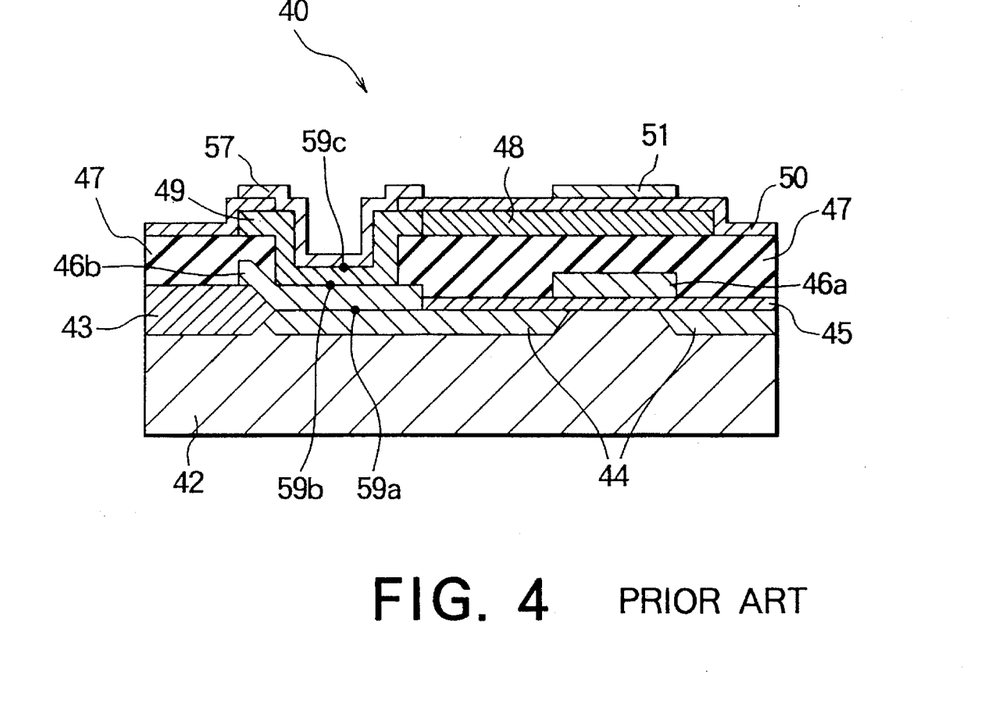
FIG. 4 shows a sectional view along an I—I line in FIG. 3.

Referring to FIGS. 3 and 4 in addition to FIG. 2, description will proceed to a structure of the static memory cell 40. The static memory cell 40 comprises a P-type silicon substrate 42, a field oxide isolation film 43, an N+ diffused film 44, a gate oxide film 45, a pair of gate electrodes 46a and 46b. The second transistor 22 is formed by the silicon substrate 42, the field oxide isolation film 43, the diffused film 44, the gate oxide film 45, and the gate electrode 46b. The secondary transistor 32 is formed by the silicon substrate 42, the field oxide isolation film 43, the diffused film 44, the gate oxide film 45, and the gate electrode 46a.

The static memory cell 40 further comprises a layer insulation film 47, a high resistance polysilicon region 48 on the layer insulation film 47, an N-type polysilicon region 49, a gate oxide film 50, an N-type polysilicon region 51, a P-type polysilicon region 52, and a P-type polysilicon region 53. In the example being illustrated, both of the high resistance polysilicon region 48 and the N-type polysilicon region 49 are used as the gate electrode of the first transistor 21 illustrated in FIG. 2. The N-type polysilicon region 51 is used as a channel of the first transistor 21. The P-type polysilicon region 52 is used as the drain of the first transistor 21. The P-type polysilicon region 53 is used as the source of the first transistor 21.

As shown in FIG. 3, the static memory cell 40 comprises a high resistance polysilicon region 54, an N-type polysilicon region 55, an N-type polysilicon region 56, a P-type polysilicon region 57, and a P-type polysilicon region 58. Both of the high resistance polysilicon region 54 and the N-type polysilicon region 55 are used as the gate electrode of the primary transistor 31 illustrated in FIG. 2. The N-type polysilicon region 56 is used as a channel of the primary transistor 31. The P-type polysilicon region 57 is used as the drain of the primary transistor 31. The P-type polysilicon region 58 is used as the source of the primary transistor 31.

The diffused film 44, the gate electrode 46b, the N-type polysilicon region 49, the P-type polysilicon region 57 are connected to one another through contact holes 59a to 59c so that the node N1 is formed which is illustrated in FIG. 2. Similarly, the diffused film 44, the gate electrode 46a, the N-type polysilicon region 55, the P-type polysilicon region 52 are connected to one another through the contact hole 59a and contact holes 60a and 60b so that the node N2 is formed which is illustrated in FIG. 2.

The P-type polysilicon regions 53 and 58 are applied with the reference voltage Vcc. The first and the second resistors 41b and 41c illustrated in FIG. 2 are formed by the high resistance polysilicon regions 48 and 54, respectively.

A first capacitance may be formed between the P-type polysilicon region 57 and the high resistance polysilicon region 54. A second capacitance may be formed between the P-type polysilicon region 52 and the high resistance polysilicon region 48. A third capacitance may be formed between the high resistance polysilicon region 48 and the N-type polysilicon region 55. In addition, a fourth capacitance may be formed between the high resistance polysilicon region 54 and the N-type polysilicon region 49. The capacitance of the capacitor 41a illustrated in FIG. 2 is defined by the first through the fourth capacitances.

Figure 5:
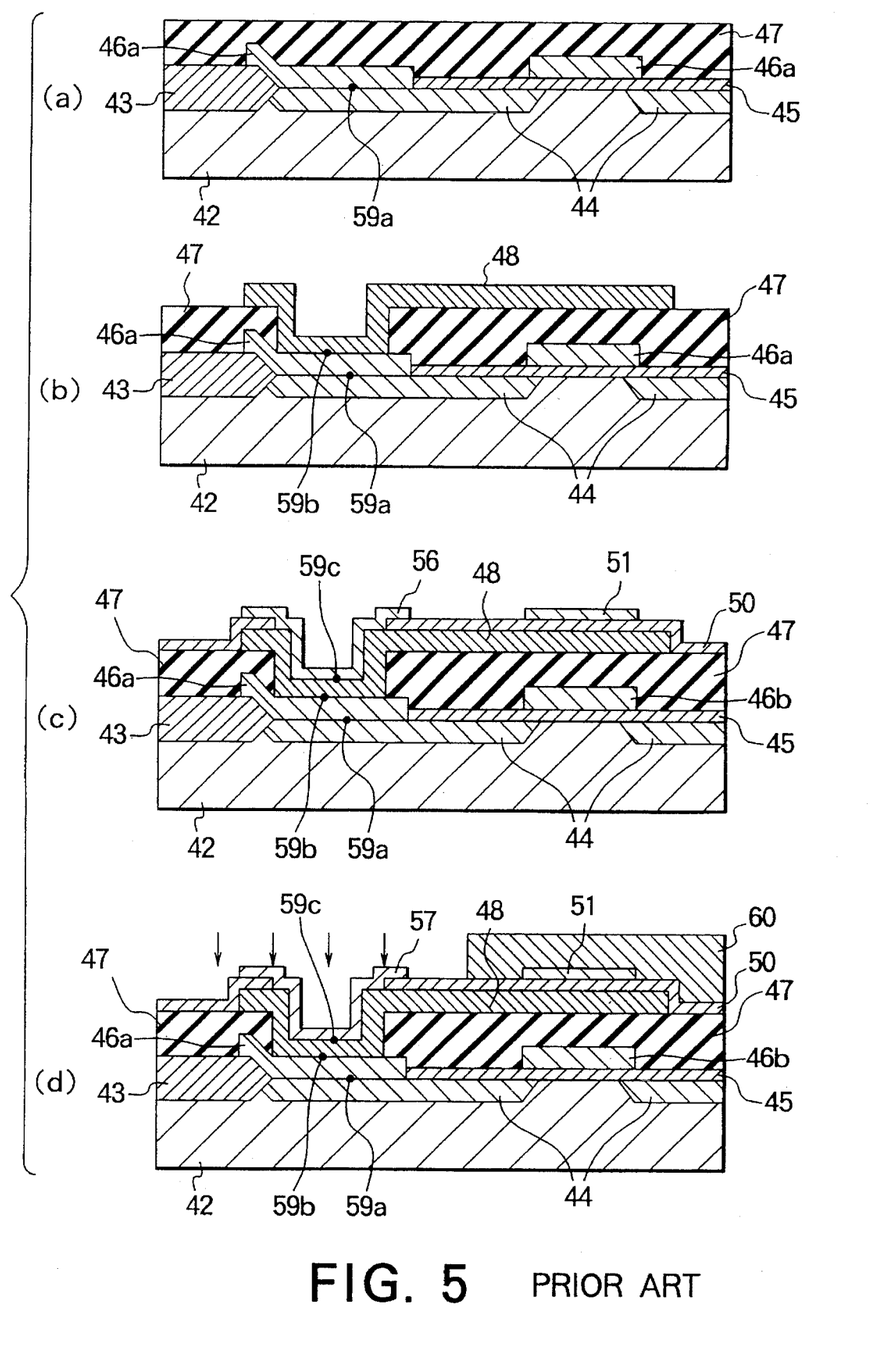
FIG. 5 shows a sectional view for describing a manufacture process of the SRAM cell illustrated in each of FIGS. 3 and 4.

Referring to FIG. 5, description will be made as regards manufacturing the static memory cell 40 illustrated in FIGS. 3 and 4.

Firstly referring to FIG. 5(a), the silicon substrate 42 includes a P-type impurity which is doped at a density between $10^{16}$ cm$^{-3}$ and $10^{18}$ cm$^{-3}$ in the silicon substrate 42. Use is made of local oxidation of silicon (LOCOS) on depositing the field oxide isolation film 43 on the silicon substrate 42. The field oxide isolation film 43 has a thickness between 200 nanometers and 600 nanometers. Deposition of the gate oxide film 45 is carried out at a thickness between 5 nanometers and 20 nanometers.

After that, formation of contact hole 59a is carried out by photoetching. The gate electrode 46a is formed on the gate oxide film 45. The gate electrode 46b is formed on the field oxide isolation film 43 and the silicon substrate 42. Each of the gate electrodes 46a and 46b may be, for example, an N-type polysilicon film including an N-type impurity at density between $10^{20}$ cm$^{-3}$ and $10^{21}$ cm$^{-3}$. Each of the gate electrodes 46a and 46b may be, for example, a multi-layer having a silicide film and the N-type polysilicon film.

By using each of the gate electrodes 46a and 46b as a mask, use is made of ion implantation on forming the N$^+$ diffused film 44. The N$^+$ diffused film 44 includes an N-type impurity at density between $10^{20}$ cm$^{-3}$ and $10^{21}$ cm$^{-3}$. On forming the N$^+$ diffused film 44 located under the gate electrode 46b, the N-type impurity may be implanted from the gate electrode 46b. In addition, the N$^+$ diffused film located under the gate electrode 46b may be formed by ion implantation on forming the contact hole 59a. Deposition of the layer insulation film 47 is carried out by using low pressure chemical vapor deposition (LPCVD).

Referring to FIG. 5(b), formation of the contact hole 59b is carried out by photoetching. Deposition of an undoped polysilicon film is carried out at a thickness between 40 nanometers and 200 nanometers by using the LPCVD. The undoped polysilicon film is processed into the high resistance polysilicon region 48 by photoetching. In order to control the resistance value of the high resistance polysilicon region 48, an N-type impurity may be implanted into the high resistance polysilicon region 48 at the density between $10^{x}$ cm$^{-3}$ and $10^{19}$ cm$^{-3}$ by ion implantation.

Referring to FIG. 5(c), deposition of the gate oxide film 50 is carried out at a thickness between 5 nanometers and 50 nanometers by the LPCVD. Formation of the contact hole 59c is carried out by photoetching. Deposition of amorphous silicon films are carried out at a thickness between 10 nanometers and 100 nanometers by the LPCVD. The amorphous silicon films are annealed at a temperature of about 600° C. during 3 hours to 30 hours in order to process the amorphous silicon films into crystallized polysilicon films. An N-type impurity is implanted into a first one of the crystallized polysilicon films at a density between $10^{16}$ cm$^{-3}$ and $10^{18}$ cm$^{-3}$ by ion implantation in order to process the first crystallized polysilicon film into a first N-type polysilicon film. The first N-type polysilicon film is processed into the N-type polysilicon region 56 by photoetching. Similarly, an N-type impurity is implanted into a second one of the crystallized polysilicon films at the density between $10^{16}$ cm$^{-3}$ and $10^{18}$ cm$^{-3}$ by ion implantation in order to process the second crystallized polysilicon film into a second N-type polysilicon film. The second N-type polysilicon film is processed into the N-type polysilicon region 51 by photoetching.

Referring to FIG. 5(d), a P-type impurity is implanted into the first N-type polysilicon region 56 by ion implantation by using a photo resist 61 as a mask as shown at arrows in FIG. 5(d) before a heat process in order to form the P-type polysilicon region 57 on the N-type polysilicon region 56. The P-type polysilicon region 57 includes the P-type impurity between $10^{18}$ cm$^{-3}$ and $10^{19}$ cm$^{-3}$.

Again referring to FIGS. 2 to 4, the static memory cell 40 has the gate electrodes 46a and 46b and the N$^+$ diffused film 44 each of which includes the N-type impurity at a high density. On the other hand, it is difficult to make the P-type impurity be a high density in each of the P-type polysilicon regions 52 and 57 inasmuch as a leak current becomes great when the P-type impurity is included at a high density in each of the P-type polysilicon regions 52 and 57. When the above-mentioned heat process is carried out, the N-type impurity is diffused into the high resistance polysilicon films 48 and 54. As a result, each of the high resistance polysilicon films 48 and 54 may become to an N-type polysilicon region having a low resistance value. This makes an effective length decrease in each of the first and the second resistors 41b and 41c. Therefore, each of the first and the second resistors 41b and 41c has the low resistance as the static memory cell 40 is micronized in size.

As described above, it is necessary for each of the first and the second resistors 41b and 41c to have the resistance value greater than 108 ohms. However, it is impossible for each of the first and the second resistors 41b and 41c to have the resistance value greater than $10^8$ ohms when the static memory cell 40 is micronized in size to approach to a submicron size. As a result, it is difficult to obtain an effective delay effect in the delay circuit 41. It is difficult to prevent the static memory cell 40 from the soft error or the unstability based on the noise or the alpha rays when the static memory cell 40 is micronized in size.

Figure 6:
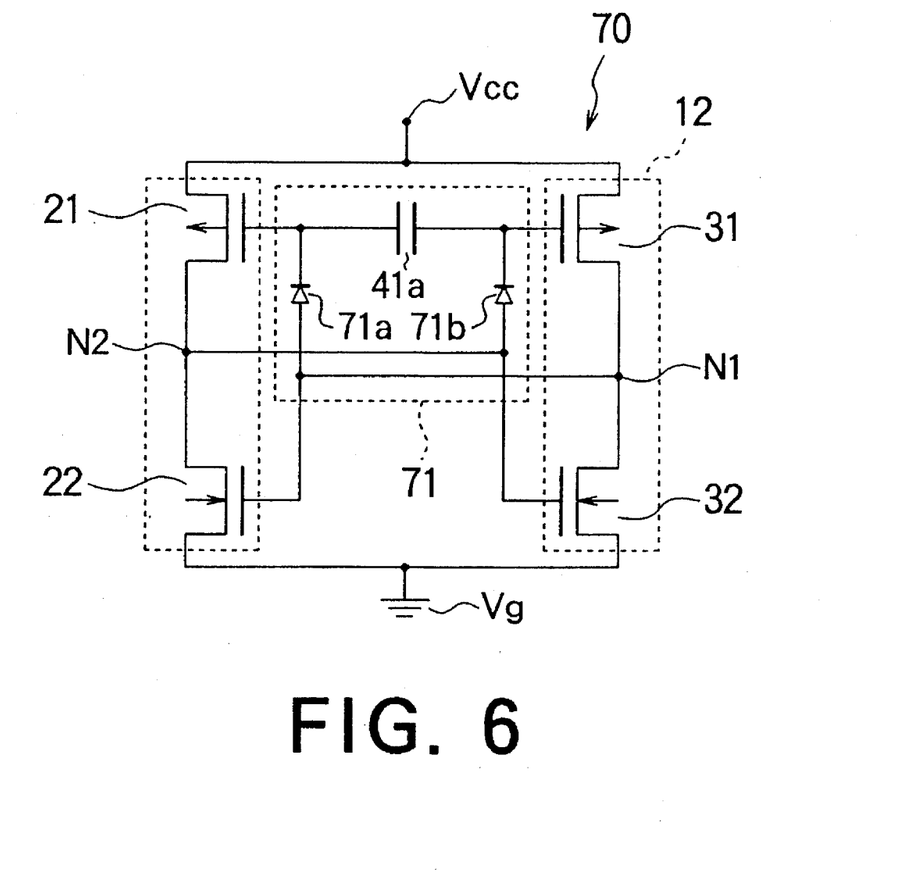
FIG. 6 is a circuit diagram of a SRAM cell according to a preferred embodiment of this invention.

Referring to FIG. 6, description will proceed to a semiconductor memory device according to a preferred embodiment of this invention. The semiconductor memory device may be a static random access memory (SRAM). The SRAM comprises a plurality of static memory cells although only one of the static memory cells is illustrated in FIG. 6. In FIG. 6, the static memory cell is different in structure from the static memory cell 40 illustrated in FIG. 2 and is therefore designated afresh by a reference numeral 70. The static memory cell 70 comprises a delay circuit which is different in structure from the delay circuit 41 illustrated in FIG. 2. Therefore, the delay circuit is designated afresh by a reference numeral 71. The static memory cell 70 comprises similar parts which are designated by like reference numerals.

The delay circuit 71 comprises first and second diodes 71a and 71b instead of the first and the second resistors 41b and 41c illustrated in FIG. 2. Each of the first and the second diodes 71a and 71b may be, for example, a PN junction diode. In the example being illustrated, the gate of the first transistor 21 is connected to the gate of the second transistor 22 through the first diode 71a. More particularly, the cathode of the first diode 71a is connected to the gate of the first transistor 21. The anode of the first diode 71a is connected to the gate of the second transistor 22. Furthermore, the anode of the first diode 71a is connected to the drains of the primary and the secondary transistors 31 and 32.

Similarly, the cathode of the second diode 71b is connected to the gate of the primary transistor 31. The anode of the second diode 71b is connected to the gate of the secondary transistor 32. Furthermore, the anode of the second diode 71b is connected to the drains of the first and the second transistors 21 and 22.

In FIG. 6, it will be assumed that the logic high and low levels appear at the nodes N2 and N1, respectively. When the high level appear at the node N2, the first transistor 21 is in the on-state. Otherwise, the second transistor 22 is in the off-state. When the low level appears at the node N1, the primary transistor 31 is in the off-state and the secondary transistor 32 is in the on-state.

It will be assumed that the voltage of the node N2 instantaneously drops on the basis of noise or alpha rays. In a time instant at which the instantaneous voltage drop occurs, the high level has appeared at the gate of the primary transistor 31 yet although the voltage of the node N2 becomes to the low level. As described above, the cathode of the second diode 71b is connected to the gate of the primary transistor 31. The anode of the second diode 71b is connected to the node N2. Therefore, the second diode 71b is supplied with a bias voltage which is directed against the forward direction of the second diode 71b. As a result, the delay circuit 71 has a time constant of a large value inasmuch as the second diode 71a is operable as a resistor having a high resistance value.

When the delay circuit 71 has a time constant longer than a predetermined time period, the voltage of the node N2 is recovered to the high level before the primary transistor 31 becomes to the on-state as described in conjunction with FIG. 2. Therefore, it is possible to prevent the static memory cell 70 from unstability based on the noise or the alpha rays.

As readily understood from the above description, it is possible to prevent the static memory cell 70 from unstability based on the noise or the alpha rays when the first diode 71a has a first forward direction from the node N1 to the gate of the first transistor 21 and when the second diode 71b has a second forward direction from the node N2 to the gate of the primary transistor 31.

Figure 7:
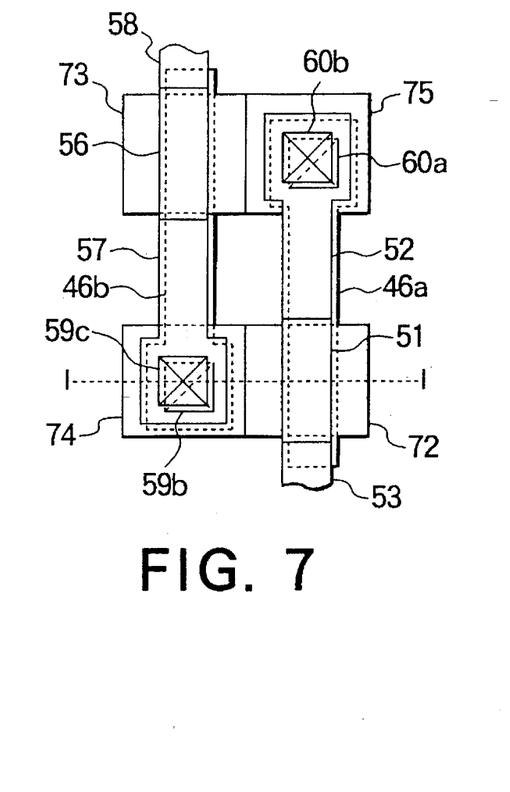
FIG. 7 shows a plane view of an example of the SRAM cell illustrated in FIG. 6.
Figure 8:
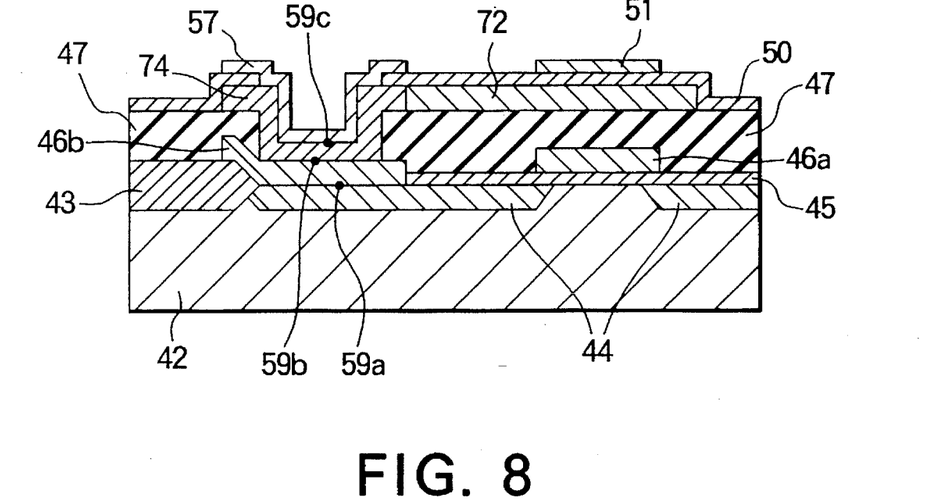
FIG. 8 shows a sectional view along an I—I line in FIG. 7.

Referring to FIGS. 7 and 8 in addition to FIG. 6, description will proceed to a structure of the static memory cell 70. In FIGS. 7 and 8, the static memory cell 70 is different in structure from the static memory cell 40 illustrated in FIGS. 3 and 4 and comprises similar parts which are designated by like reference numerals. The static memory cell 70 comprises N-type polysilicon regions 72 and 73 instead of the high resistance polysilicon regions 48 and 54, respectively. The static memory cell 70 further comprises P-type polysilicon regions 74 and 75 instead of the N-type polysilicon regions 49 and 55, respectively. The gate of the first transistor 21 illustrated in FIG. 6 is formed by the N-type polysilicon region 72 and the P-type polysilicon region 74. The gate of the primary transistor 31 illustrated in FIG. 6 is formed by the N-type polysilicon region 73 and the P-type polysilicon region 75. As readily understood from FIGS. 7 and 8, it is possible for the static memory cell 70 to have the first and the second diodes 71a and 71b illustrated in FIG. 6 inasmuch as the static memory cell 70 has the N-type polysilicon regions 72 and 73 and the P-type polysilicon regions 74 and 75.

In the static memory cell 70 illustrated in FIGS. 7 and 8, a fifth capacitance may be formed between the P-type polysilicon region 57 and the N-type polysilicon region 73. A sixth capacitance may be formed between the P-type polysilicon region 52 and the N-type polysilicon region 72. A seventh capacitance may be formed between the P-type polysilicon region 74 and the N-type polysilicon region 73. In addition, an eighth capacitance may be formed between the P-type polysilicon region 75 and the N-type polysilicon region 72. The capacitance of the capacitor 41a illustrated in FIG. 6 is defined by the fifth through the eighth capacitances.

Figure 9:
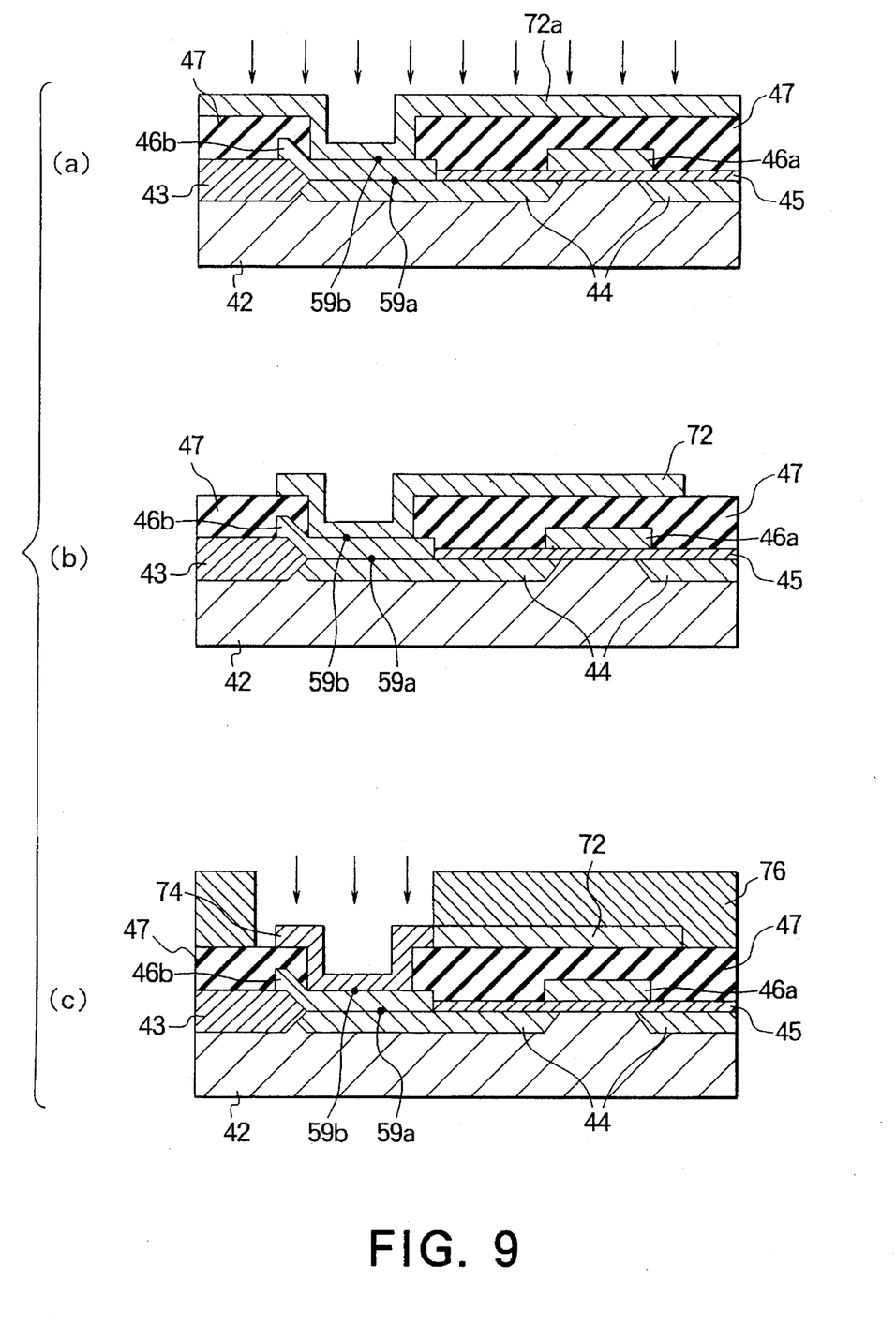
FIG. 9 shows a sectional view for describing a manufacture process of the SRAM cell illustrated in each of FIGS. 7 and 8.

Referring to FIG. 9, description will be made as regards manufacturing the static memory cell 70 illustrated in FIGS. 7 and 8. Firstly, process is carried out by using a similar manner described in conjunction with FIG. 5(a).

After formation of the contact hole 59b is carried out by photoetching, deposition of an undoped polysilicon film is carried out at a thickness between 20 nanometers and 200 nanometers by using LPCVD. In order to process the undoped polysilicon film into an N-type polysilicon film 72a, an N-type impurity is implanted into the undoped polysilicon film at a density between $10^{17}$ cm$^{-3}$ and $10^{18}$ cm$^{-3}$ by ion implantation as shown by arrows in FIG. 9(a). The N-type polysilicon film 72a is patterned into the N-type polysilicon region 72 as shown in FIG. 9(b). An amorphous silicon film may be used instead of the undoped polysilicon film. In this case, deposition of the amorphous silicon film is carried out at the thickness between 20 nanometers and 200 nanometers by using LPCVD. The amorphous silicon film is crystallized into a crystallized polysilicon film at a temperature of about 600° C. In order to process the crystallized polysilicon film into the N-type polysilicon film 72a, an N-type impurity is implanted into the crystallized polysilicon film at a density between $10^{17}$ cm$^{-3}$ and $10^{18}$ cm$^{-3}$ by ion implantation.

By using a photoresist film 76 as a mask, a P-type impurity is implanted into the N-type polysilicon region 72 by ion implantation as shown by arrows in FIG. 9(c) in order to form the P-type polysilicon region 74. Inasmuch as the N-type impurity is diffused into the P-type polysilicon region 74 from the gate electrodes 46a and 46b at a density between $10^{20}$ cm$^{-3}$ and $10^{21}$ cm$^{-3}$, it is desirable for the P-type polysilicon region 74 to include the P-type impurity at a density between $10^{21}$ cm$^{-3}$ and $10^{22}$ cm$^{-3}$.

The above-mentioned processes are followed by similar processes described in conjunction with FIGS. 5(c) and 5(d) in order to manufacture the static memory cell 70.

Figure 10:
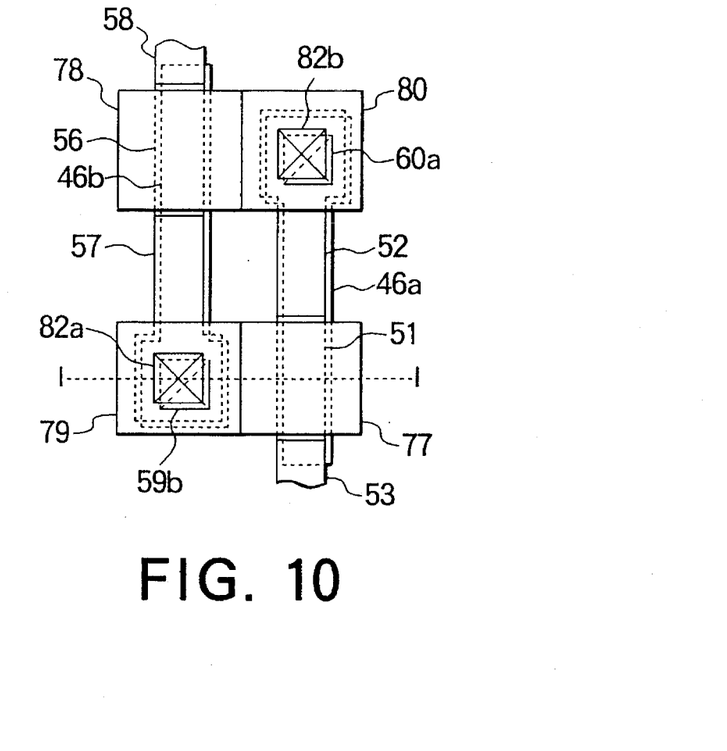
FIG. 10 shows a plan view of another example of the SRAM cell illustrated in FIG. 6.
Figure 11:
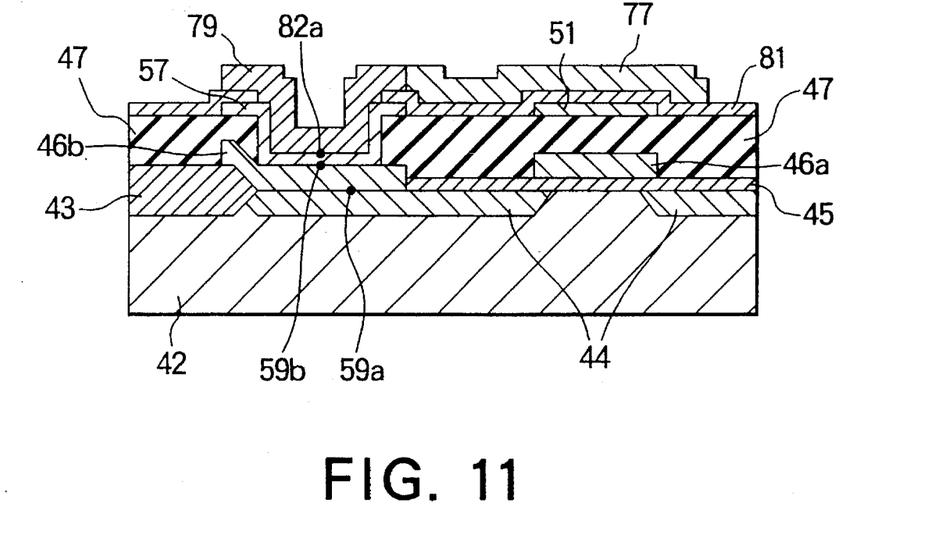
FIG. 11 shows a sectional view along an I—I line in FIG. 10.

Referring to FIGS. 10 and 11 in addition to FIG. 6, description will proceed to another structure of the static memory cell 70. In FIGS. 7 and 8, the static memory cell 70 is different in structure from the static memory cell 40 illustrated in FIGS. 3 and 4 and comprises similar parts which are designated by like reference numerals. The static memory cell 70 comprises N-type polysilicon regions 77 and 78 and P-type polysilicon regions 79 and 80.

In FIGS. 10 and 11, the N-type polysilicon region 51 is operable as the channel of the first transistor 21 illustrated in FIG. 6. The P-type polysilicon regions 52 and 53 are operable as the drain and the source of the first transistor 21, respectively. Similarly, the N-type polysilicon region 56 is operable as the channel of the primary transistor 31 illustrated in FIG. 6. The P-type polysilicon regions 57 and 58 are operable as the drain and the source of the primary transistor 31, respectively.

The static memory cell 70 comprises a gate oxide film 81. Both of the N-type polysilicon region 77 and the P-type polysilicon region 79 are formed in contact with the gate oxide film 81. Both of the N-type polysilicon region 77 and the P-type polysilicon region 79 are operable as the gate electrode of the first transistor 21 illustrated in FIG. 6. Similarly, both of the N-type polysilicon region 78 and the P-type polysilicon region 80 are formed in contact with the gate oxide film 81. Both of the N-type polysilicon region 78 and the P-type polysilicon region 80 are operable as the gate electrode of the primary transistor 31 illustrated in FIG. 6.

The $N^+$ diffused film 44, the gate electrode 46b, and the P-type polysilicon regions 57 and 79 are connected to one another by the contact holes 59a and 59b and a contact hole 82a in order to form the node N1 illustrated in FIG. 6. The $N^+$ diffused film 44, the gate electrode 46a, and the P-type polysilicon regions 52 and 80 are connected to one another by the contact holes 59a and 60a and a contact hole 82b in order to form the node N2 illustrated in FIG. 6. The first diode 71a illustrated in FIG. 6 is formed between the P-type polysilicon region 79 and the N-type polysilicon region 77. The second diode 71b illustrated in FIG. 6 is formed between the P-type polysilicon region 80 and the N-type polysilicon region 78.

Figure 12:
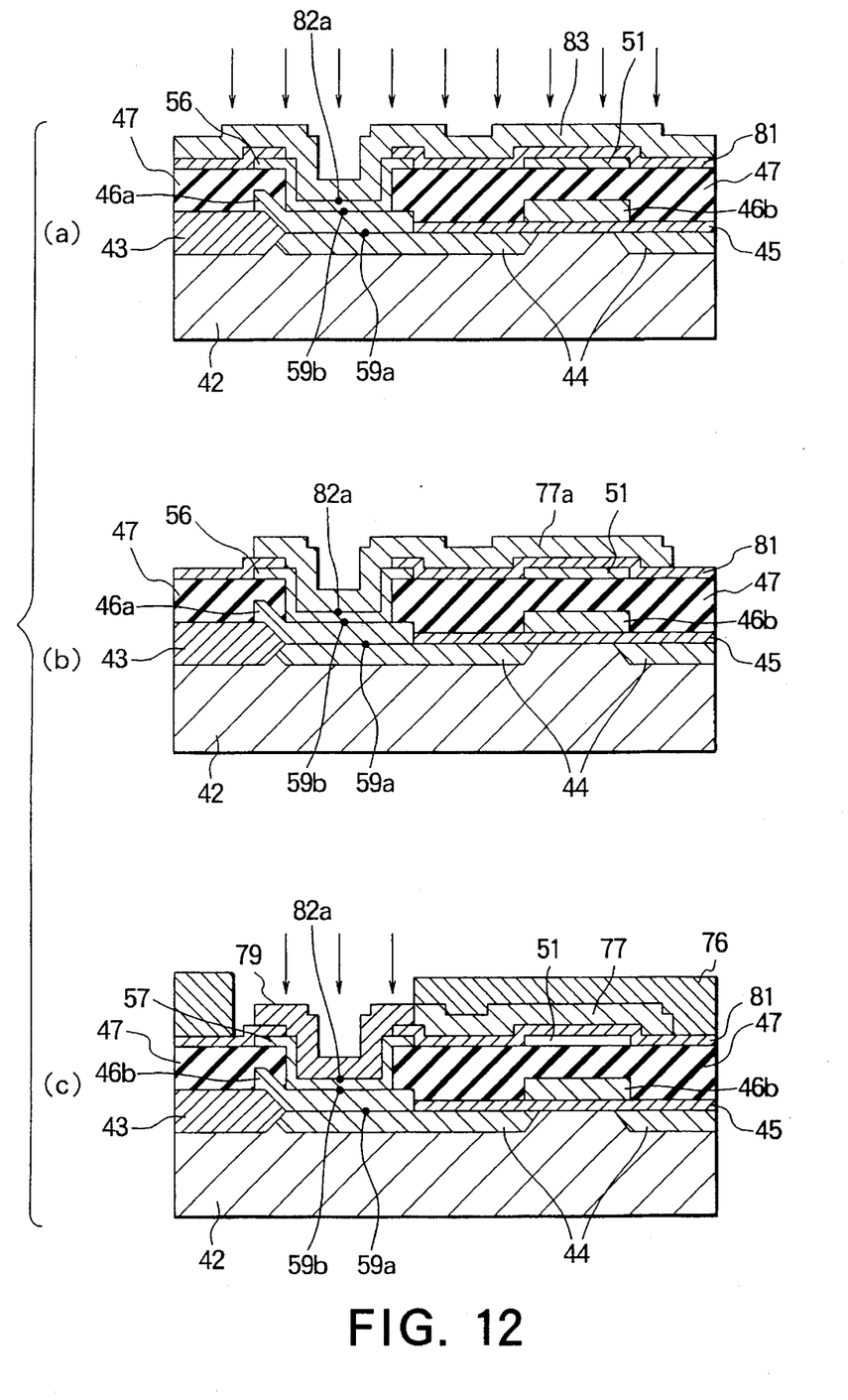
FIG. 12 shows a sectional view for describing a manufacture process of the SRAM cell illustrated in each of FIGS. 10 and 11.

Referring to FIG. 12, description will De made as regards manufacturing the static memory cell 70 illustrated in FIGS. 10 and 11. Firstly, process is carried out by using a similar manner described in conjunction with FIG. 5(a).

After formation of the contact holes 59b and 60a is carried out by photoetching, formation of the N-type polysilicon regions 56 and 51 is carried out by using a similar manner described in conjunction with FIG. 5(b). Deposition of the gate oxide film 81 is carried out by LPCVD. The gate oxide film 81 has a thickness between 5 nanometers and 50 nanometers. Formation of the contact holes 82a and 82b is carried out by photoetching. Formation of a polysilicon film 83 is carried out by LPCVD. The polysilicon film 83 has a thickness between 100 nanometers and 300 nanometers. In order to process the polysilicon film 83 into an N-type polysilicon film 77a, an N-type impurity is implanted into the crystallized polysilicon film 83 at a density between $10^{17}$ cm$^{-3}$ and $10^{18}$ cm$^{-3}$ by ion implantation as shown by arrows in FIG. 12(a). The N-type polysilicon film 77a is patterned into the N-type polysilicon region 77 by photoetching as shown in FIG. 12(b). Formation of the N-type polysilicon region 78 is carried out in a similar manner described above.

By using the photoresist film 76 as the mask, a P-type impurity is implanted into the N-type polysilicon region 77 by ion implantation as shown by arrows in FIG. 12(c) in order to form the P-type polysilicon region 79 which has the P-type impurity at a density between $10^{19}$ cm$^{-3}$ and $10^{20}$ cm$^{-3}$. Formation of the P-type polysilicon region 80 is carried out in a similar manner described above.

In a similar manner described in con-junction with FIG. 5(d), formation of P-type polysilicon regions 57, 52, 58, and 53 are carried out. Inasmuch as the P-type impurity is diffused from the P-type polysilicon region 79 to the P-type polysilicon region 57 by heat treatment, it is possible to introduce the P-type impurity into a part of the P-type polysilicon region 57 covered with the P-type polysilicon region 79.

In the static memory cell 70 illustrated in FIGS. 10 and 11, one polysilicon film is formed between the P-type polysilicon region 79 and the gate electrode 46b. As a result, it is possible to restrain the N-type impurity from being diffused from the gate electrode 46b. Similarly, one polysilicon film is formed between the P-type polysilicon region 80 and the gate electrode 46a. Therefore, it is possible to restrain the N-type impurity from being diffused from the gate electrode 46a.

Figure 13:
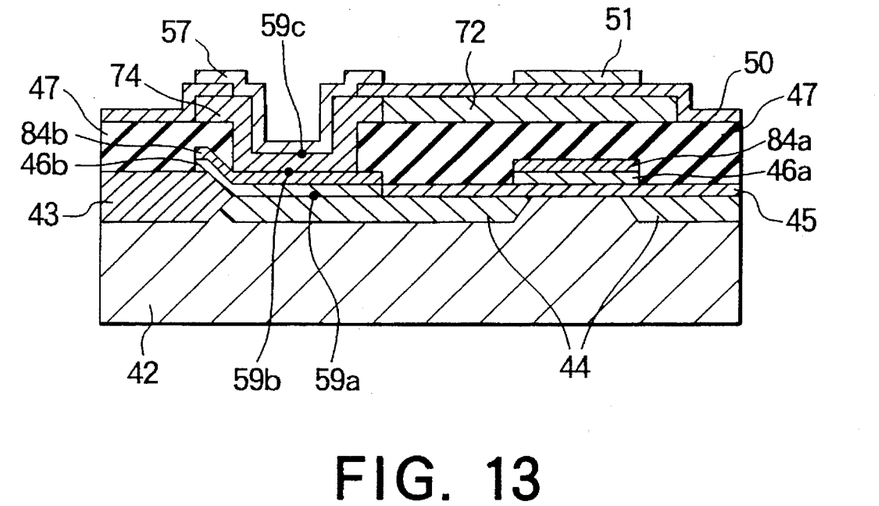
FIG. 13 shows a sectional view of still another example of the SRAM cell illustrated in FIG. 6.

Referring to FIG. 13 in addition to FIG. 6, description will proceed to still another structure of the static memory cell 70. The static memory cell 70 illustrated in FIG. 13 is similar in structure to the static memory cell 70 illustrated in FIGS. 8 and 9 except that the static memory cell 70 illustrated in FIG. 13 further comprises barrier films 84a and 84b. The barrier films 84a and 84b are formed on the gate electrodes 46a and 46b, respectively. The barrier film 84a is for use in restraining the impurity from being diffused from the gate electrode 46a. Similarly, the barrier film 84b is for use in restraining the impurity from being diffused from the gate electrode 46b. Each of the barrier films 84a and 84b may be composed of titanium nitride.

On forming the barrier films 84a and 84b, the barrier films 84a and 84b are formed on the gate electrodes 46a and 46b by CVD or sputtering, respectively, before patterning of the gate electrodes 46a and 46b is carried out. The barrier films 84a and 84b are subjected to patterning in addition to the gate electrodes 46a and 46b.

In the static memory cell illustrated in FIG. 13, it is possible to effectively restrain the N-type impurity from being diffused from the gate electrode 46b to the P-type polysilicon region 57. Similarly, it is possible to effectively restrain the N-type impurity from being diffused from the gate electrode 46a to the P-type polysilicon region 52. As a result, it is easy to control the first and the second diodes 71a and 71b illustrated in FIG. 6 inasmuch as it is unnecessary to have very high impurity density in the P-type polysilicon regions 74 and 75 illustrated in FIG. 7.

In addition, the primary transistor 31 illustrated in FIG. 6 is able to effectively supply the current to the node N1 inasmuch as a resistance value does not increase which exists between the gate electrode 46b and the P-type polysilicon region 57. Similarly, the first transistor 21 illustrated in FIG. 6 is able to effectively supply the current to the node N2 inasmuch as a resistance value does not increase which exists between the gate electrode 46a and the P-type polysilicon region 52.

Figure 14:
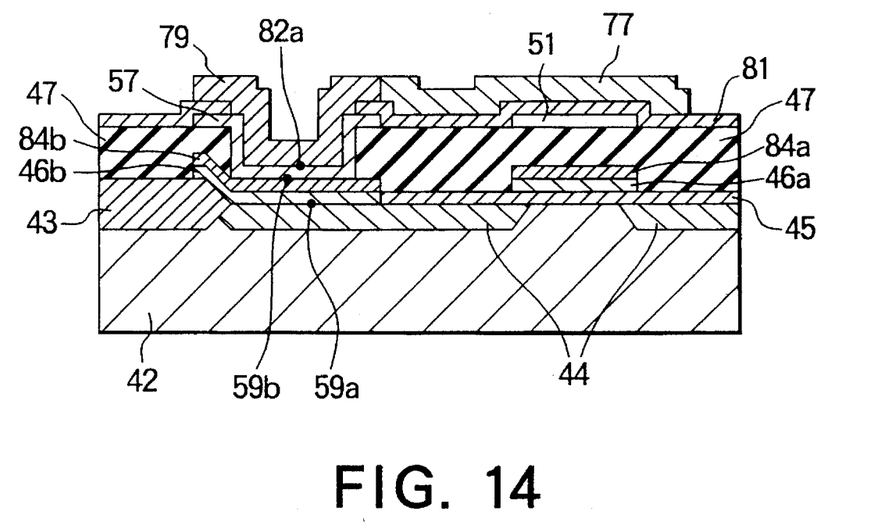
FIG. 14 shows a sectional view of still further another example of the SRAM cell illustrated in FIG. 6.

Referring to FIG. 14 in addition to FIG. 6, description will proceed to still further another structure of the static memory cell 70. The static memory cell 70 illustrated in FIG. 14 is similar in structure to the static memory cell 70 illustrated in FIGS. 10 and 11 except that the static memory cell 70 illustrated in FIG. 14 further comprises barrier films 84a and 84b. The barrier films 84a and 84b are formed on the gate electrodes 46a, and 46b, respectively. The barrier film 84a is for use in restraining the impurity from being diffused from the gate electrode 46a. Similarly, the barrier film 84b is for use in restraining the impurity from being diffused from the gate electrode 46b. Each of the barrier films 84a and 84b may be composed of titanium nitride.

On forming the barrier films 84a and 84b, the barrier films 84a and 84b are formed on the gate electrodes 46a and 46b by CVD or sputtering, respectively, before patterning of the gate electrodes 46a and 46b is carried out. The barrier films 84a and 84b are subjected to patterning in addition to the gate electrodes 46a and 46b.

In the static memory cell illustrated in FIG. 14, it is possible to effectively restrain the N-type impurity from being diffused from the gate electrode 46b to the P-type polysilicon region 57. Similarly, it is possible to effectively restrain the N-type impurity from being diffused from the gate electrode 46a to the P-type polysilicon region 52. As a result, it is easy to control the first and the second diodes 71a and 71b illustrated in FIG. 6 inasmuch as it is unnecessary to have very high impurity density in the P-type polysilicon regions 79 and 80 illustrated in FIG. 10.

In addition, the primary transistor 31 illustrated in FIG. 6 is able to effectively supply the current to the node N1 inasmuch as a resistance value does not increase which exists between the gate electrode 46b and the P-type polysilicon region 57. Similarly, the first transistor 21 illustrated in FIG. 6 is able to effectively supply the current to the node N2 inasmuch as a resistance value does not increase which exists between the gate electrode 46a and the P-type polysilicon region 52.

What is claimed is:

1. A semiconductor memory device comprising:

a set of cross-coupled inverters having first and second inverters, said first inverter comprising a first transistor of a first conductivity type and a second transistor of a second conductivity type, said second inverter comprising a primary transistor of said first conductivity type and a secondary transistor of said second conductivity type;

a first diode having a first forward direction which is directed from drains of said primary and said secondary transistors to a gate of said first transistor;

a second diode having a second forward direction which is directed from drains of said first and said second transistors to a gate of said primary transistor; and an insulating member, wherein:

each of said first and said primary transistors is a thin-film transistor;

said first transistor is formed on said secondary transistor through said insulating member;

said primary transistor is formed on said second transistor through said insulating member;

said first diode is located in the gate of said first transistor; and said second diode is located in the gate of said primary transistor.

2. A semiconductor memory device as claimed in claim 1, wherein said semiconductor memory device further comprises a capacitor through which the gate of said first transistor is connected to the gate of said primary transistor.

3. A semiconductor memory device as claimed in claim 1, wherein:

said first conductivity type is a P-type; and said second conductivity type is an N-type.

4. A semiconductor memory device as claimed in claim 1, wherein semiconductor memory device further comprises a conductive barrier member formed on the gate of each of said second and said secondary transistors.

5. A semiconductor memory device as claimed in claim 1, wherein:

said first transistor has a first gate, a first drain, and a first source, said first source being connected to a reference voltage;

said primary transistor has a primary gate, a primary drain, and a primary source, said primary source being connected to said reference voltage;

said second transistor has a second gate, a second drain, and a second source, said second source being connected to ground, said second drain being connected to said first drain;

said secondary transistor has a secondary gate, a secondary drain, and secondary source, said secondary source being connected to said ground, said secondary drain being connected to said primary drain;

said first diode having a first cathode and a first anode, said first cathode being connected to said first gate, said first anode being connected to said second gate and said primary and said secondary drains;

said second diode having a second cathode and a second anode, said second cathode being connected to said primary gate, said second anode being connected to said secondary gate and said first and said second drains; and wherein the semiconductor memory device further comprises:

a capacitor through which said first gate is connected to said primary gate.

\* \* \* \* \*

UNITED STATES PATENT AND TRADEMARK OFFICE
CERTIFICATE OF CORRECTION

PATENT NO. : 5,536,960
DATED : July 16, 1996
INVENTOR(S) : Fumihiko HAYASHI

It is certified that error appears in the above-indentified patent and that said Letters Patent is hereby corrected as shown below:

Column 5, line 56, delete "10<" and insert --$10^{21}$--.

Column 6, line 13, delete "10*" and insert --$10^{16}$--.

Column 6, line 63, delete "108" and insert --$10^8$--.

Column 9, line 50, delete "De" and insert --be--.

Column 10, lines 9-10, delete "$10^>$ cm·3" and insert --$10^{22}$ cm$^{-3}$--.

Signed and Sealed this

Twelfth Day of November, 1996

BRUCE LEHMAN

Attest:

*Attesting Officer*  *Commissioner of Patents and Trademarks*